United States Patent [19]

Oshima

[11] Patent Number: 5,814,848
[45] Date of Patent: Sep. 29, 1998

[54] SEMICONDUCTOR INTEGRATED CIRCUIT HAVING REDUCED WIRING CAPACITANCE

[75] Inventor: Shigeo Oshima, Yokohama, Japan

[73] Assignee: Kabushiki Kaisha Toshiba, Kawasaki, Japan

[21] Appl. No.: 656,385

[22] Filed: May 31, 1996

[30] Foreign Application Priority Data

May 31, 1995 [JP] Japan .................................. 7-133943

[51] Int. Cl.[6] .......................... H01L 27/10; H01L 29/76; H01L 29/94; H01L 31/062
[52] U.S. Cl. .......................... 257/210; 257/386; 257/396; 257/503; 257/508
[58] Field of Search ................................. 257/208, 210, 257/386, 396, 503, 508

[56] References Cited

U.S. PATENT DOCUMENTS

| | | | |
|---|---|---|---|
| 4,984,050 | 1/1991 | Kobayashi . | |
| 5,286,998 | 2/1994 | Ema | 257/637 |
| 5,414,297 | 5/1995 | Marita et al. | 257/620 |
| 5,608,241 | 3/1997 | Shibuya et al. | 257/207 |
| 5,608,248 | 3/1997 | Ohno | 257/306 |

*Primary Examiner*—Ngân V. Ngô
*Attorney, Agent, or Firm*—Foley & Lardner

[57] ABSTRACT

In a semiconductor integrated circuit, the wiring capacitance of the bus line region is reduced, so that the operation speed can be increased, the power consumption can be decreased, and the chip size can be reduced. On the upper surface of the field oxide film (4) formed on the semiconductor substrate (8), a non-conductive insulating oxide film (12) is formed by oxidizing the poly silicon layer (9). Further, the bus lines (3A) are formed on the oxide film (12) via the interlayer insulating film (6). Therefore, a distance between the bus lines (3A) and the substrate (8) can be increased to decrease the capacitance of the bus lines (3A).

8 Claims, 7 Drawing Sheets

SEMICONDUCTOR INTEGRATED CIRCUIT HAVING REDUCED WIRING CAPACITANCE

FIELD OF THE INVENTION

The present invention relates to a semiconductor integrated circuit and a method of manufacturing the same circuit, and more specifically to a semiconductor integrated circuit suitable for high operation speed through a reduction of the wiring capacitance, and a method of manufacturing the same circuit.

BACKGROUND OF THE INVENTION

With the steady advance of the integration rate of semiconductor integrated circuits, the integrated circuits have become more and more microminiaturized. Accordingly, the size of the circuit block integrated within a single chip has been increased and further complicated, so that space required for a wiring region (a bus line region) for connecting the circuit blocks to one another has increased. As a result, the proportion of the wiring capacitance to the capacitance load of the respective circuit signals has increased.

FIG. 6 shows a general circuit arrangement of a typical semiconductor integrated circuit, in which the semiconductor integrated circuit 1 is composed of a circuit block region (i.e., integrated circuit region) 2 for forming transistor elements, resistance elements, capacitance elements, etc., and a bus line region (i e., a non-activated or field region) 3 for inputting, outputting and transmitting a circuit signal group of the circuit block region 2.

In the bus line region 3, because a great number of wires are arranged, there inevitably exist various wiring (load) capacitances. Therefore, when these load capacitances are large, it is necessary to increase the current drive capability of the respective transistors to drive (i.e., charge and discharge) the loads. In this case, however, in order to increase the transistor drive capability, since the transistor size must be increased, there arises another problem in that the chip size and power consumption both increase.

To reduce an increase of the above-mentioned wiring capacitance load, a conventional integrated circuit construction as shown in FIG. 7 has been proposed. In FIG. 7 (and the other drawings), the enlargement scale factor is different between the vertical and horizontal directions to facilitate understanding the structure. In the bus line region 3 of the conventional integrated circuit shown in FIG. 7, an insulating film 5 is selectively formed between an element separating field oxide film 4 formed of $SiO_2$ and an interlayer insulating film 6 formed by a CVD oxide film or PSG protective film, in order to increase a distance t between the bus line region wiring layer 7 formed on the interlayer insulating film 6 and a semiconductor substrate 8, that is, to reduce the wiring capacitance Cp for each unit area.

In the above-mentioned example, the wiring capacitance Cp can be expressed as $$Cp = \epsilon/t \qquad (1)$$

where $\epsilon$ denotes a dielectric constant of the interlayer film such as the field oxide film 4, the insulating film 5 and the interlayer insulating film 6.

As understood by the above expression, since the wiring capacitance is inversely proportional to the distance t, it is preferable to increase the distance t as much as possible. In the above-mentioned conventional integrated circuit, however, it is not easy to grow the interlayer film selectively and further to increase the thickness thereof to some extent, from a technical standpoint. Therefore, at present, a simple and effective method of reducing the wiring capacitance Cp has not yet been realized.

In more detail, in general since the bus line region 3 does not include the transistor (active) region, over the distance t from the semiconductor substrate 8 to the bus line region wiring layer 7 (which is usually an Al metal), there inevitably exist the element separating field oxide film 4, the insulating film 5, and the interlayer insulating film 6. Therefore, the total thickness thereof is about 20000 angstrom.

Of this thickness, the thickness of the insulating film 5 selectively grown on the field oxide film 4 is limited to about 500 angstrom in the case of a low temperature oxide film or CVD oxide film. Therefore, the contribution rate of the insulating film 5 to the total distance t is as low as 2 to 3% when the wiring capacitance must be reduced.

When the wiring capacitance cannot be reduced, since the transistor current drive capability must be increased, the power consumption increases. Further, since the transistor size, that is, the channel width increases, the area of the circuit block region 2 increases, so that the pattern area is enlarged, thus causing an increase in the chip size and raising the manufacturing cost of the integrated circuit.

Further, when the chip size increases, an increase of the wiring capacitance cannot be disregarded, thus causing a vicious circle.

As described above, since the suppression of an increase of the wiring capacitance relates to a problem of the manufacturing cost (i.e., the product competition in the market), this problem is particularly serious in the field of complicated logic circuits, and specially ordered memory circuits which require high speed operation.

SUMMARY OF THE INVENTION

Accordingly, it is an object of the present invention to provide a semiconductor integrated circuit and a method of manufacturing the same circuit which can realize the high speed operation, lower power consumption, and chip size reduction, by reducing the wiring capacitance, that is, by selectively increasing the interlayer film thickness markedly under the bus line region.

To achieve the above-mentioned object, the present invention provides a method of manufacturing a semiconductor integrated circuit, comprising the steps of: arranging a wiring layer changeable from a conductive status to a non-conductive status later, on a semiconductor substrate; and changing the arranged wiring layer to the non-conductive status in a wiring region where only wires are to be formed, while keeping the arranged wiring layer in the conductive status in an active region where circuit elements are to be formed.

Further, the present invention provides a method of manufacturing a semiconductor integrated circuit, comprising the steps of: arranging a wiring layer changeable from a conductive status to a non-conductive status later, on a semiconductor substrate; and changing the arranged wiring layer to the non-conductive status partially in a thickness direction of the wiring layer but holding remaining conductive status portions in a floating status at a wiring region where only wires are to be formed, while keeping the arranged wiring layer in the conductive status in an active region where circuit elements are to be formed.

Further, the present invention provides a method of manufacturing a semiconductor integrated circuit, comprising the steps of: forming an element-separating field oxide film in a surface portion of a semiconductor substrate at such a position as to correspond to a bus line region formed between a pair of circuit block regions; forming a poly silicon layer to cover at least the field oxide film; forming an insulating film to cover the poly silicon layer; removing the insulating film at a portion over the field oxide film, and further forming an oxide film by oxidizing the exposed poly silicon layer; forming an interlayer insulating film at least over the oxide film and the field oxide film; and forming a wiring layer over the interlayer insulating film.

Further, the present invention provides a semiconductor integrated circuit comprising: an element separating field oxide film formed in a surface portion of a semiconductor substrate at such a position as to correspond to a bus line region formed between a pair of circuit block regions; an insulating film formed by changing a poly silicon wiring layer formed on said field oxide film; an interlayer insulating film extending to the circuit block regions, for covering said field oxide film and said insulating film; and aluminum wires arranged on said interlayer insulating film.

Further, the present invention provides a semiconductor integrated circuit comprising: a semiconductor substrate; an element separating field oxide film formed in a surface portion of a semiconductor substrate at such a position as to correspond to a bus line region formed between a pair of circuit block regions, said field oxide film having first sloping surfaces each rising from an end to an inner side thereof; an insulating film formed from a poly silicon wiring layer on an inner side of said field oxide film, said insulating film having second sloping surfaces each rising from an end to an inner side thereof in such a way that a smooth synthesized sloping surface can be formed continuously from each first sloping surface to each second sloping surface, respectively; a first interlayer insulating film extending to the circuit blocks, for covering at least said field oxide film and said insulating film, said first interlayer insulating film having sloping surfaces each for smoothly covering the synthesized sloping surface; and a first contact wire formed by a first aluminum wiring layer arranged on said first interlayer insulating film, for covering at least the covered sloping surface.

Further, the present invention provides a semiconductor integrated circuit comprising: a semiconductor substrate; an element separating field oxide film formed in a surface portion of a semiconductor substrate at such a position as to correspond to a bus line region formed between a pair of circuit block regions, said field oxide film having first sloping surfaces each rising from an end to an inner side thereof; an insulating film formed from a poly silicon wiring layer on an inner side of said field oxide film, said insulating film having second sloping surfaces each rising from an end to an inner side thereof in such a way that a smooth synthesized sloping surface can be formed continuously from each first sloping surface to each second sloping surface, respectively; an interlayer insulating film extending to the circuit blocks, for covering at least said field oxide film and said insulating film, said first interlayer insulating film having sloping surfaces each for smoothly covering the synthesized sloping surface; and bus line wires and a contact wire both formed by a first aluminum wiring layer arranged on said interlayer insulating film, said bus line wires being arranged on a surface of said interlayer insulating film at such positions as to correspond to said insulating film, said contact wire being connected to a transistor formed on said semiconductor substrate and further being formed with a sloped wiring portion for covering the synthesized sloped surface.

In the semiconductor integrated circuit according to the present invention, the interlayer insulating capacitance between the wiring formed in the wiring region and the semiconductor substrate is reduced by intervening a non-conductive wiring layer.

Further, in the semiconductor integrated circuit according to the present invention, the interlayer insulating capacitance between the wires formed in the wiring region and the semiconductor substrate is reduced via a conductive wiring layer kept in a floating status, even if not kept in a perfectly non-conductive status in the thickness direction of the wiring layer.

DETAILED DESCRIPTION OF THE EMBODIMENTS

Embodiments of the semiconductor integrated circuit according to the present invention will be described hereinbelow with reference to the attached drawings.

Figure 1:
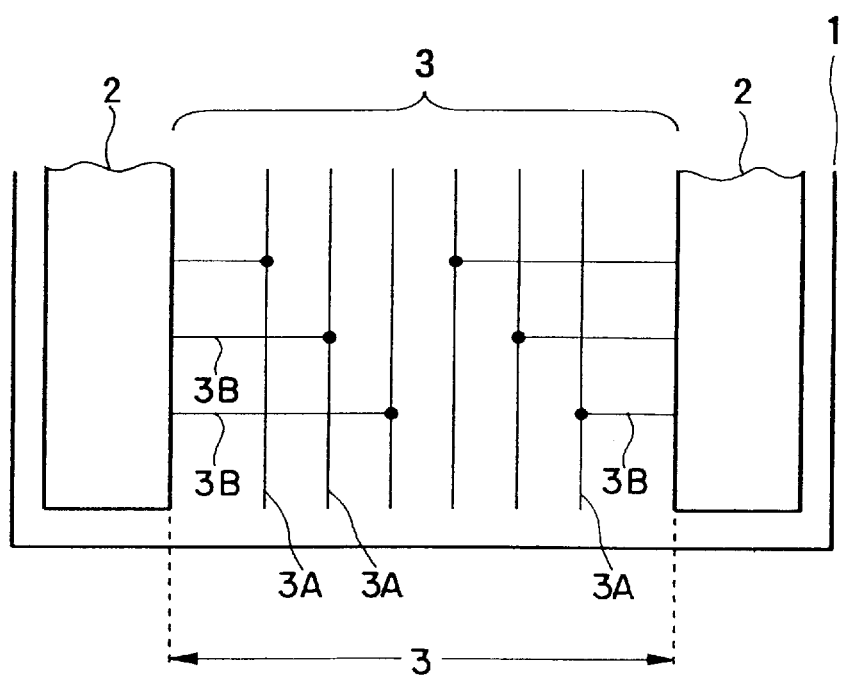
FIG. 1 is a plane view showing an embodiment of the semiconductor integrated circuit according to the present invention.

FIG. 1 is a plane view showing a first embodiment thereof, and FIGS. 2(A) to 2(E) are cross-sectional views for assistance in explaining the manufacturing process thereof.

Figure 2A:
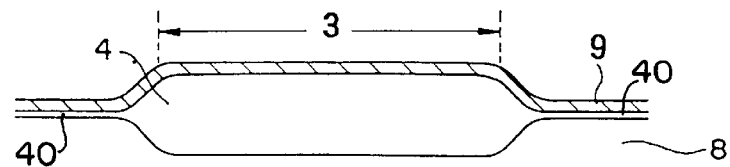
FIG. 2(A) to 2(E) are cross-sectional views illustrating the manufacturing process of a first embodiment of the semiconductor integrated circuit according to the present invention.

As shown in FIG. 1, a semiconductor integrated circuit 1 is composed of some circuit block regions 2 and a bus line region 3. In the bus line region 3, there are arranged bus lines 3A and wires 3B for connecting the bus line 3A to circuits formed in the circuit block region 2. The integrated circuit as shown in FIG. 1 can be formed in accordance with the manufacturing process as follows:

First, as shown in FIG. 2(A), an element separating field oxide film 4 is formed all over the surface of the semiconductor substrate 8 in such a way as to become selectively thick at only the region where the bus line regions 3 are to be formed, but not at circuit block regions 2, indicated by reference numeral 40.

Figure 2B:
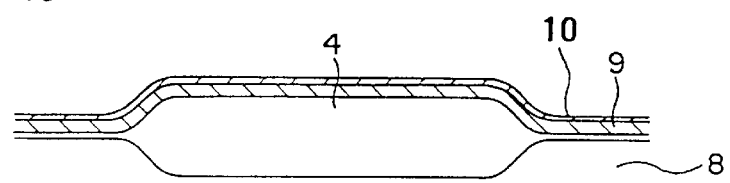
Figure 2C:
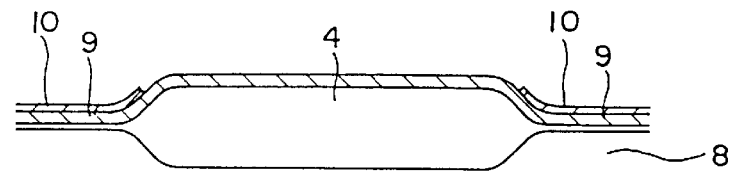
Figure 2D:
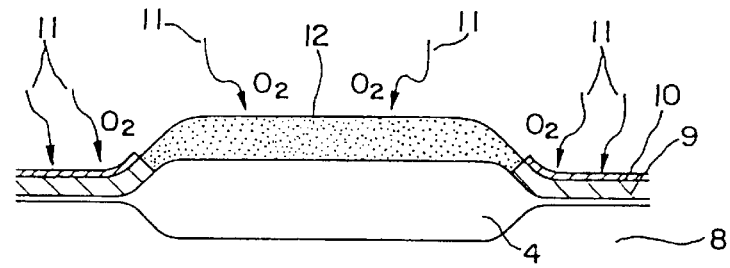
Figure 2E:
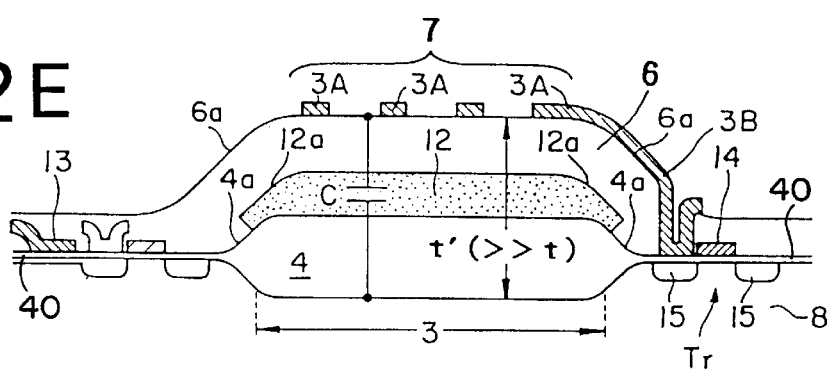

In more detail, when the semiconductor integrated circuit 1 is DRAM, a poly silicon layer 9 is formed are all over the surface of the entire field oxide film 4, in order to form plate electrodes 13 of memory cells and gate electrodes 14 of the transistors (both shown in FIG. 2(E)) in the circuit block region (i.e., active region) 2, and to form either of bit line wires or multi-layer wires in the bus line region (i.e., wiring region) 3.

Further, as shown in FIG. 2(B), the entire surface of the poly silicon layer 9 is covered with an insulating film 10 formed of a material not oxidized thermally such as silicon nitride (SiN) in the case of silicon process, for instance.

Further, as shown in FIG. 2(C), the insulating film 10 is selectively removed by etching at positions corresponding to only the bus line region 3. Further, as shown in FIG. 2(D), the entire wafer is thermo-oxidized in an oxygen atmosphere 11.

As a result, the poly silicon layer 9 is oxidized into an oxide film 12. Here, although the film thickness of the formed poly silicon layer 9 is 1500 to 2000 angstrom, the oxide film 12 can be grown by thermal oxidation up to a thickness about twice the thickness of the poly silicon layer 9. In order to reduce the wiring capacitance, the thicker the oxide film 12 is, the better will be the result. Therefore, it is preferable to grow the oxide film 12 up to about 4000 angstrom, for instance.

After that, as shown in FIG. 2(E), the insulating film 10 is removed.

Successively, various circuit elements such as the plate electrodes 13 of the memory cells, the gate electrodes 14 of the transistors, wires, etc. are formed in the circuit block regions 2 of the semiconductor substrate 8, that is, on the non-thermally-oxidized poly silicon layer 9 corresponding to the transistor regions such as source/drain regions 15 to be formed on the semiconductor substrate 8.

After that, an interlayer insulating film 6 is formed over the entire surface of the integrated circuit 1.

Further, a bus line region wiring layer 7 is formed on the interlayer insulating film layer 6 at the area corresponding to the bus line region 3. Here, the bus line region wiring layer 7 can also be formed as a multilayer.

As a result of the above-mentioned process, the thickness of the interlayer film 6 formed between the semiconductor substrate 8 and the bus line region wiring layer 7 can be increased to as thick as 23000 to 25000 angstrom, for instance. Therefore, it is possible to markedly reduce the wiring capacitance down to about 12 to 25% of that of the conventional integrated circuit in which the interlayer film thickness is about 20,000 angstrom.

In general, when the interlayer insulating film as thick as described above is formed, various problems arise in that the wiring is broken open at the wiring regions due to a height difference between the thick portion and the surrounding portion thereof during the microminiaturization process, and in that the transistor characteristics deteriorate due to bird's beak portions formed at the active region (e.g., the element separation becomes imperfect or the transistor width is narrowed), etc. In the present invention, however, since the high difference is limited to only the bus line region 3; that is, since there exists no difference in height in the active regions, there arises no problem, except the regions where an extremely precise micro-miniaturization is required as with the case of the memory cell array. Further, in order to further smoothen (i.e., form gentle) both the sloping ends of the interlayer insulating film 6, it is preferable to form both the ends 12a of the oxide film 12 (See FIG. 2(E)) into a gentle shape or to reduce the width of the oxide film 12 in such a way that the three-layer structure (composed of the field oxide film 4, the oxide film 12 and the interlayer insulating film 6) can be formed with a more gradual slope.

In this case, it may be considered such a harmful side effect that the effective gate length of each circuit transistor is shortened or the overlap capacitance of the source/drain regions increases. However, since a decrease in the effective gate length due to thermal process can be easily estimated, no serious problem occurs, as far as the mask is formed under due consideration of these factors.

Further, in the above-mentioned process, although any of a plurality of poly silicon wiring layers formed under a single layer or a multilayer of the metallic wiring layers can be utilized, when a wire formed under the transistor gate electrode wire 14 (or a wire of the plate electrode 13 of the memory cell in the case of the DRAM) is used, since the thick interlayer film can be formed at the bus line region 3 before forming the transistors, it is possible to form the integrated circuit without exerting harmful influence upon the transistor characteristics.

Further, since the poly silicon layer 9 of high impurity concentration has such a nature that the thermal oxidization is accelerated, after the insulating film 10 has been etched, it is preferable to implant impurities onto the poly silicon layer 9 at the exposed bus line region 3. In this case, it is possible to thermo-oxidize the poly silicon layer 9 into the oxide film 12 as the perfect interlayer insulating film, sufficiently in a short time even at a low temperature. As a result, it is possible to reduce the harmful side effect to the circuit elements due to the thermal effect to as small as possible.

Further, as understood by FIG. 2(E), a synthesized sloping surface is formed in combination with the first sloping surface 4a of the field oxide film 4 and a second sloping surface 12a of the oxide film 12. Further, this synthesized sloping surface is covered with the interlayer insulating film 6 as a coated sloping surface 6a.

Figure 3:
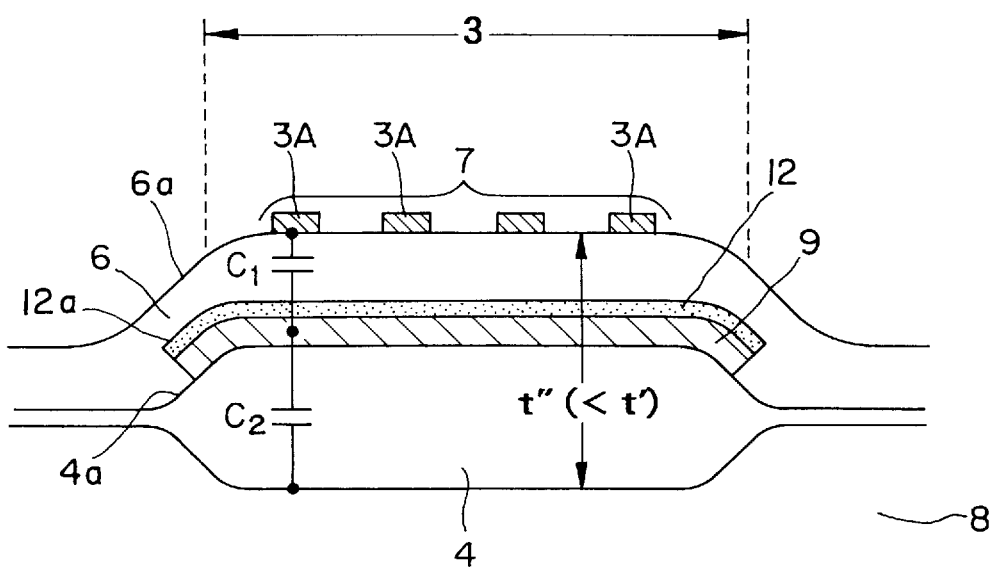
FIG. 3 is a cross-sectional view illustrating the manufacturing process of a second embodiment of the semiconductor integrated circuit according to the present invention.

FIG. 3 is a cross-sectional view showing a second embodiment of the present invention, in which only the final process is shown.

In the case where the additional thermal process is limited due to the restriction of the processing conditions, it is impossible to perfectly oxidize the poly silicon layer 9 formed under the bus line region 3. Therefore, the poly silicon layer 9 inevitably remains under the oxide film 12 formed by thermal oxidization.

Here, however, since the potential of the poly silicon layer 9 is not connected to any fixed potentials, the poly silicon layer 9 is kept in a floating status. In this case, the capacitance C between the bus line region wiring layer 7 and the semiconductor substrate 7 can be reduced as $$1/C = (1/C1) + (1/C2) \qquad (2)$$

where C1 denotes the capacitance between the poly silicon layer 9 and the bus line region wiring layer 7, and C2 denotes the capacitance between the poly silicon layer 9 and the semiconductor substrate 8.

Here, if the capacitance C1 is not equal to the capacitance C2, since the capacitance C between the bus line region wiring layer 7 and the semiconductor substrate 8 can be expressed as $$C < C1/2 \qquad (3)$$

Therefore, it is possible to reduce the capacitance C, as compared with the conventional structure having no floating terminal between the bus line region wiring layer 7 and the semiconductor substrate 8.

FIGS. 4(A) to 4(E) are cross-sectional views showing a third embodiment of the present invention. This third embodiment is different from the first embodiment shown in FIGS. 2(A) to 2(E) in that the width of the oxide film 12A is reduced in such a way as to be located within the bus line region 3. In other words, the oxide film 12A is formed inside the bus line region 3 without extending outside from the bus line region 3. Therefore, there exists a surface 4A not covered with the oxide film 12A in the upper surface of the field oxide film 4. In addition, another difference between the first embodiment and this third embodiment is that two interlayer insulating films 6 and 6A are formed and in addition that wires 3B are formed on the interlayer insulating film 6 by use of a first aluminum wiring layer and further wires 3A are formed on the interlayer insulating film 6A by use of a second aluminum wiring layer. Here, the wires 3A are used as bus lines, and the wires 3C are used as supply voltage (fixed potential) lines. The wires 3B are connected to the transistors Tr and the wires 3A are connected to the wires 3B. Further, in FIG. 4(A), 4a denotes a first sloping surface; 12a denotes a second sloping surface; and 6a denotes a covered sloping surface, in the same way as with the first embodiment.

Figure 4A:
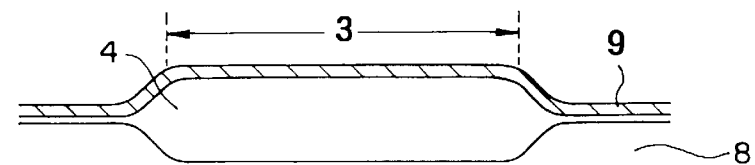
FIGS. 4(A) to 4(E) are cross-sectional views illustrating the manufacturing process of a third embodiment of the semiconductor integrated circuit according to the present invention.
Figure 4B:
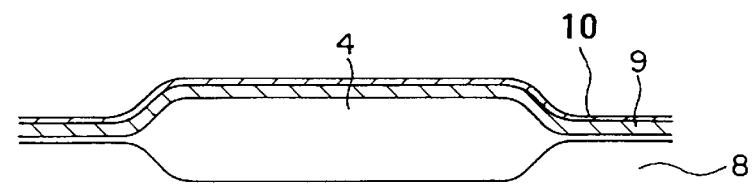
Figure 4C:
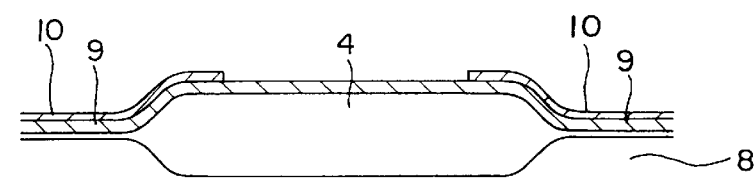
Figure 4D:
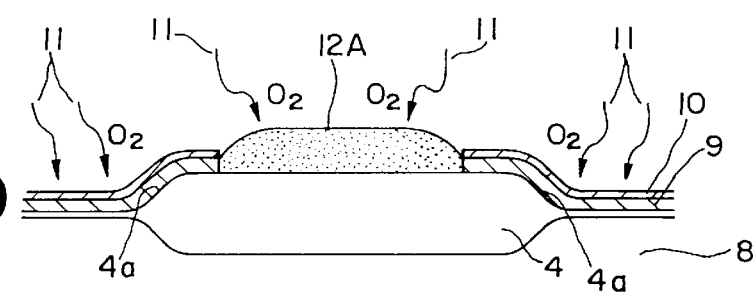
Figure 4E:
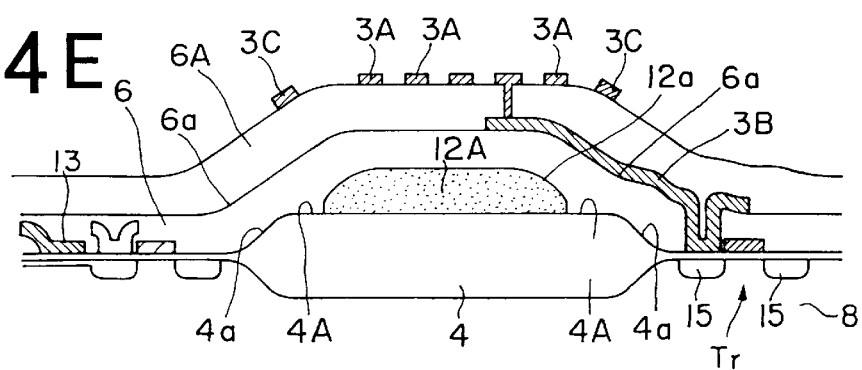

As understood in FIG. 4(E), in this embodiment, there exist such an advantage that the interlayer insulating film 6 can be formed at a gentler slope (smoothened) due to the three-layer structure of the field oxide film 4, the oxide film 12, and the interlayer insulating film, without causing any breakage of the wires 3B at the high difference portion of the interlayer insulating film 6, in addition to the reduction of the afore-mentioned capacitance.

Figure 5A:
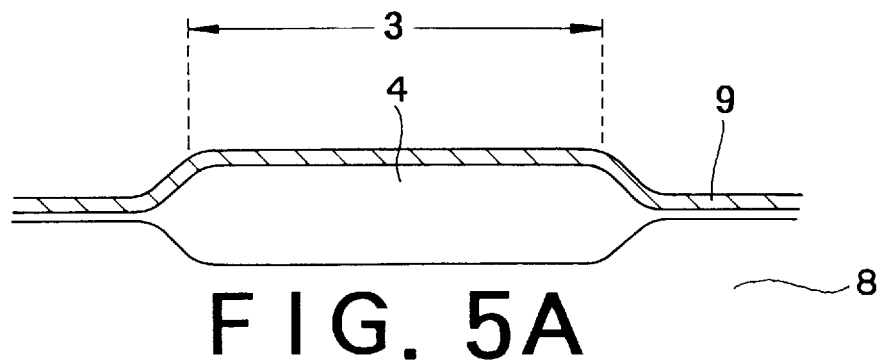
FIGS. 5(A) to 5(C) are cross-sectional views illustrating the manufacturing process of a fourth embodiment of the semiconductor integrated circuit according to the present invention.
Figure 5B:
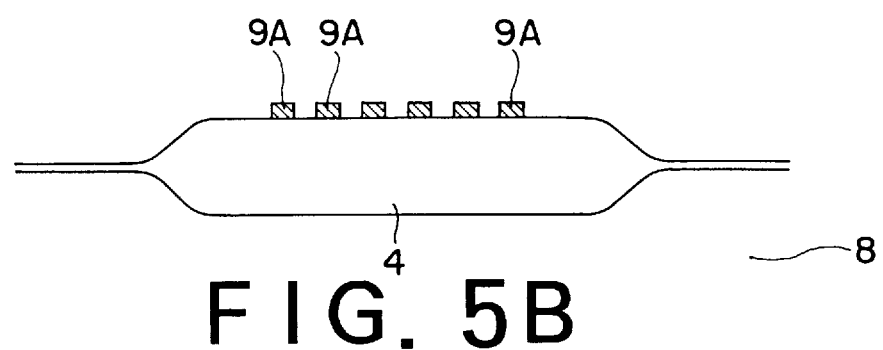
Figure 5C:
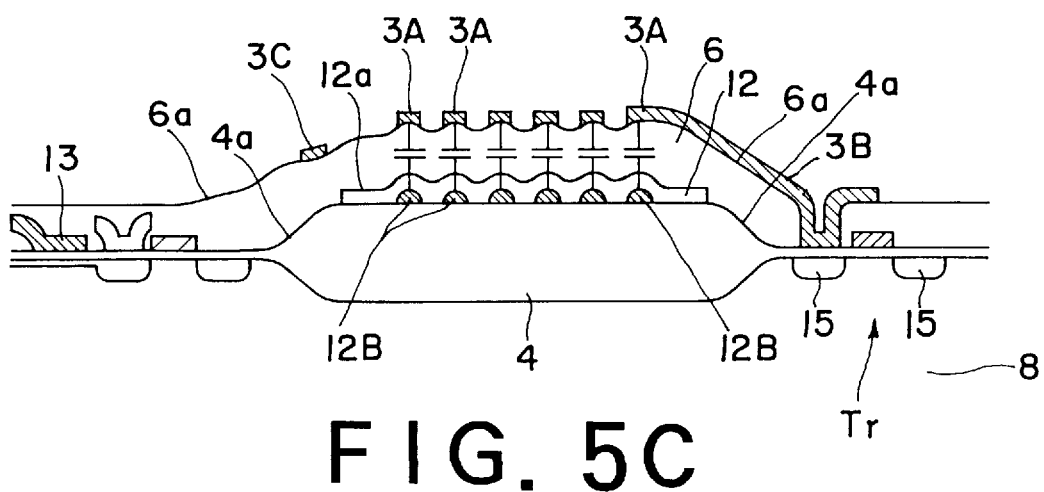
Figure 6:
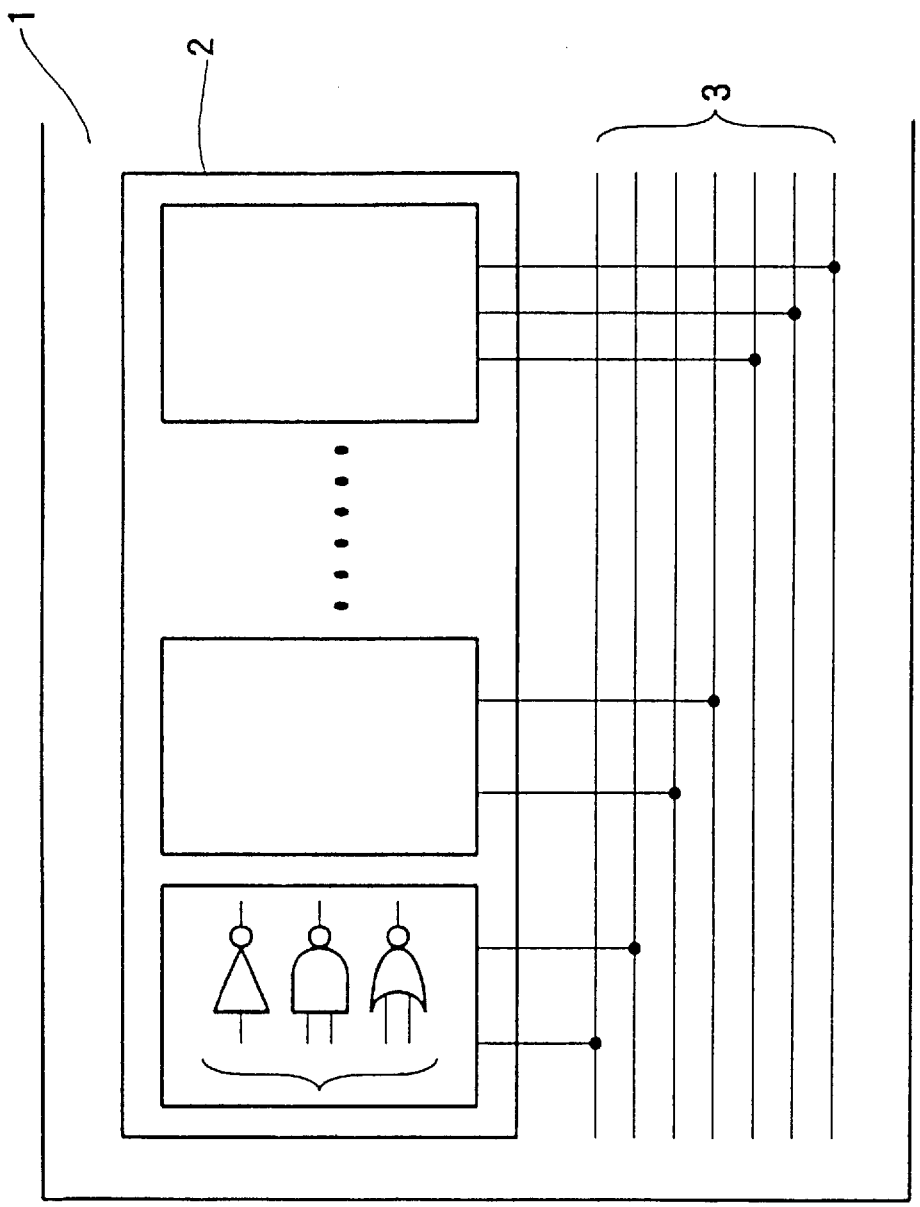
FIG. 6 is a plane view showing the circuit arrangement of the conventional semiconductor integrated circuit.
Figure 7:
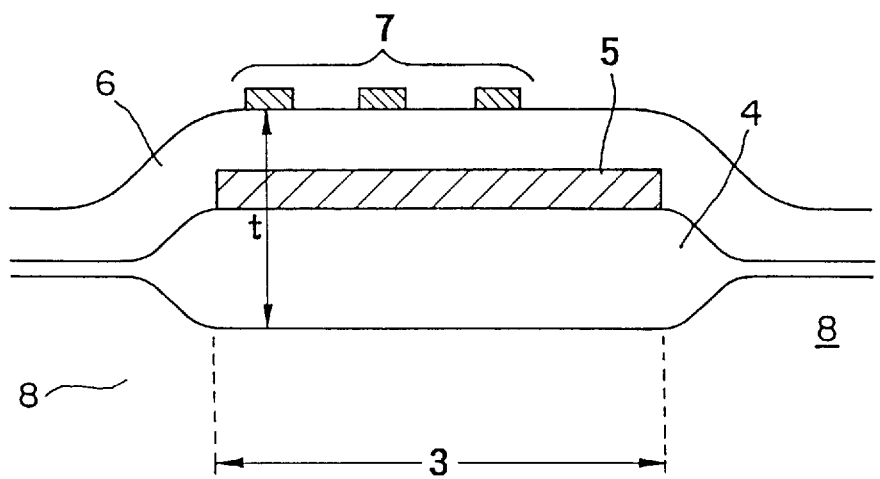
FIG. 7 is a cross-sectional view showing a conventional semiconductor integrated circuit thus far proposed to reduce the capacitance of the interlayer insulating film.

FIGS. 5(A) to 5(B) are cross-sectional views showing a fourth embodiment of the present invention. In this fourth embodiment, as well understood by FIG. 5(C), in order to increase the thickness of the poly silicon layer 9 to be formed on the field oxide film 4, the poly silicon layer is formed into a stripe shape composed of a plurality of mutually separated poly silicon film 12B, being different from the integral-formed poly silicon layer 9 as shown in FIG. 3. In this embodiment, it is possible to prevent the bus lines 3A from being coupled or interfering with each other.

In the manufacturing process of this embodiment, as shown in FIG. 5(A), the poly silicon layer 9 is formed on the field oxide film 4. After that, as shown in FIG. 5(B), the poly silicon layer 9 is etched to form the poly silicon film 9A into the stripe shape only on the field oxide film 4. After that, the oxide film 12 is formed by oxidization process. Further, the various wires 3A, 3B and 3C are formed on the oxide film 12 via the interlayer insulating film 6 in the same way as with the other embodiments.

As described above, in the semiconductor integrated circuit according to the present invention, since the thickness of the interlayer insulating film can be selectively increased in the bus line region, the wiring capacitance can be reduced, so that it is possible to increase the operation speed, decrease the power consumption, and improve the cost performance of the semiconductor integrated circuit.

In addition, in the present invention, even if the poly silicon layer is not oxidized sufficiently due to an imperfect thermal oxidization process and thereby the poly silicon layer remains in a floating status, it is possible to reduce the capacitance of the interlayer insulating film at the bus line region, as compared with that of the conventional integrated circuit.

Further, in the present invention, since the insulating film having a thickness thinner than that of the field oxide film is formed on the field oxide film, even if the insulating film and the field oxide film are covered with the interlayer insulating film, a gentle sloping surface can be obtained, so that it is possible to prevent the wiring layer formed thereon from being broken due to the height difference in the sloping surface.

Further, in the present invention, since the insulating film formed on the field oxide film is formed separately into a stripe shape without being formed as an integral layer, even if the bus lines are formed thereon via the interlayer insulating film, it is possible to prevent the formed wires from being coupled or with each other.

What is claimed is:

1. A semiconductor integrated circuit comprising:

a semiconductor substrate;

an element separating field oxide film formed in a surface portion of said semiconductor substrate at such a position as to correspond to a bus line region formed between a pair of circuit block regions, said field oxide film formed with first sloping surfaces rising inward beginning from ends thereof;

an oxide film formed in a surface portion of said semiconductor substrate at such positions as to correspond to a pair of the circuit block regions;

an oxide film formed by changing a poly silicon wiring layer formed on said field oxide film, said oxide film formed with second sloping surfaces rising inward beginning from ends thereof;

a wiring layer formed by patterning the poly silicon wiring layer formed on said oxide film;

an interlayer insulating film extending to the circuit block regions and formed with covering sloping surfaces for covering the first and second sloping surfaces, for covering said field oxide film, said oxide film and said poly silicon wiring layer; and aluminum wires arranged on said interlayer insulating film.

2. The semiconductor integrated circuit of claim 1, wherein the poly silicon wiring layer is changed to a double-layer structure such that only a surface portion thereof is changed to said oxide film and that a portion under the oxide film remains as it is in a floating status.

3. A semiconductor integrated circuit comprising:

a semiconductor substrate;

an element separating field oxide film formed in a surface portion of a semiconductor substrate at such a position as to correspond to a bus line region formed between a pair of circuit block regions, said field oxide film having first sloping surfaces each rising from an end to an inner side thereof;

an insulating film formed from a poly silicon wiring layer on an inner side of said field oxide film, said insulating film having second sloping surfaces each rising from an end to an inner side thereof in such a way that a smooth synthesized sloping surface can be formed continuously from each first sloping surface to each second sloping surface, respectively;

a first interlayer insulating film extending to the circuit blocks, for covering at least said field oxide film and said insulating film, said first interlayer insulating film having sloping surfaces each for smoothly covering the synthesized sloping surface; and a first contact wire formed by a first aluminum wiring layer arranged on said first interlayer insulating film, for covering at least the covered sloping surface.

4. The semiconductor integrated circuit of claim 3, which further comprises:

a second interlayer insulating film for covering both said first interlayer insulating film and said first contact wire;

a second contact wire formed as a data line by a second aluminum wiring layer arranged on said second interlayer insulating film; and said first contact wire being connected to a transistor formed on said semiconductor substrate via said first interlayer insulating film, and said second contact wire being connected to said first contact wire via said second interlayer insulating film.

5. The semiconductor integrated circuit of claim 4, wherein said field oxide film is formed with surface portions not covered with said insulating film in upper end surfaces thereof, and fixed potential applying wires formed by the second aluminum wring layer are arranged on said second interlayer insulating film at such positions as to corresponding to the non-covered surfaces of said field oxide film.

6. A semiconductor integrated circuit comprising:

a semiconductor substrate;

an element separating field oxide film formed in a surface portion of a semiconductor substrate at such a position as to correspond to a bus line region formed between a pair of circuit block regions, said field oxide film having first sloping surfaces each rising from an end to an inner side thereof;

an insulating film formed from a poly silicon wiring layer on an inner side of said field oxide film, said insulating film having second sloping surfaces each rising from an end to an inner side thereof in such a way that a smooth synthesized sloping surface can be formed continuously from each first sloping surface to each second sloping surface, respectively;

an interlayer insulating film extending to the circuit blocks, for covering at least said field oxide film and said insulating film, said first interlayer insulating film having sloping surfaces each for smoothly covering the synthesized sloping surface; and bus line wires and a contact wire both formed by a first aluminum wiring layer arranged on said interlayer insulating film, said bus line wires being arranged on a surface of said interlayer insulating film at such positions as to correspond to said insulating film, said contact wire being connected to a transistor formed on said semiconductor substrate and further being formed with a sloped wiring portion for covering the synthesized sloped surface.

7. The semiconductor integrated circuit of claim 6, wherein said insulating film is formed as an integral layer.

8. The semiconductor integrated circuit of claim 6, wherein said insulating film is formed as a plurality of strip-shaped conductive layers arranged separately at predetermined intervals and covered with an insulating layer.

* * * * *